(12) United States Patent
Ueda

(10) Patent No.: US 8,732,436 B2
(45) Date of Patent: May 20, 2014

(54) DEVICE FOR STORING DATA BY UTILIZING PSEUDORANDOM NUMBER SEQUENCE

(75) Inventor: Tomoaki Ueda, Kyoto (JP)

(73) Assignee: Empire Technology Development LLC, Wilmington, DE (US)

( * ) Notice: Subject to any disclaimer, the term of this patent is extended or adjusted under 35 U.S.C. 154(b) by 494 days.

(21) Appl. No.: 12/993,094

(22) PCT Filed: Jul. 2, 2010

(86) PCT No.: PCT/JP2010/004357
§ 371 (c)(1),
(2), (4) Date: Nov. 17, 2010

(87) PCT Pub. No.: WO2012/001747
PCT Pub. Date: Jan. 5, 2012

(65) Prior Publication Data
US 2012/0005455 A1    Jan. 5, 2012

(51) Int. Cl.
G06F 9/26     (2006.01)
G11C 13/04    (2006.01)

(52) U.S. Cl.
USPC ............ 711/217; 711/165; 711/200; 365/125

(58) Field of Classification Search
CPC ............... G06F 7/00; G06F 7/10; G06F 7/52; G06F 7/544; G06F 7/58; G06F 7/582; G06F 7/586; G06F 7/584; G06F 7/588; G06F 12/02; G06F 12/0207; G06F 12/08; G06F 12/0802; G06F 12/0804
USPC .......................... 711/100, 217, 218, 219, 220; 365/185.18, 185.22, 185.33, 125
See application file for complete search history.

(56) References Cited

U.S. PATENT DOCUMENTS

| | | | | |
|---|---|---|---|---|
| 5,265,226 A | * | 11/1993 | Ueda | 702/194 |
| 6,064,586 A | * | 5/2000 | Snyder et al. | 365/125 |
| 6,865,660 B2 | * | 3/2005 | Duncan | 711/217 |
| 7,209,422 B2 | | 4/2007 | Sato et al. | |
| 8,489,659 B2 | * | 7/2013 | Dunbar | 708/250 |
| 2009/0276832 A1 | * | 11/2009 | Belin et al. | 726/4 |
| 2010/0037031 A1 | * | 2/2010 | DeSantis et al. | 711/162 |

FOREIGN PATENT DOCUMENTS

| | | |
|---|---|---|
| JP | 3-201049 | 9/1991 |
| JP | 06-276067 | 9/1994 |

(Continued)

OTHER PUBLICATIONS

International Search Report for International Patent Application No. PCT/JP2010/004357 mailed on Sep. 14, 2010.

*Primary Examiner* — Arpan P. Savla
*Assistant Examiner* — Zhuo Li
(74) *Attorney, Agent, or Firm* — IPUSA, PLLC

(57) ABSTRACT

A device for storing data includes a sequence generator configured to generate a first number sequence that is a pseudorandom number sequence, a cross-correlation unit configured to produce a second number sequence that is a cross-correlation between the first number sequence and a third number sequence, and a write and read unit configured to write the second number sequence in memory and read the second number sequence from the memory, wherein the cross-correlation unit is further configured to reconstruct the third number sequence by obtaining a cross-correlation between the first number sequence and the second number sequence read from the memory.

18 Claims, 20 Drawing Sheets

(56) References Cited

FOREIGN PATENT DOCUMENTS

| | | |
|---|---|---|
| JP | 2001-155421 A | 6/2001 |
| JP | 2001-357533 A | 12/2001 |
| JP | 2006-050142 | 2/2006 |
| WO | WO 03/036641 | 5/2003 |

* cited by examiner

Fig. 6A

DEVICE FOR STORING DATA BY UTILIZING PSEUDORANDOM NUMBER SEQUENCE

TECHNICAL FIELD

The disclosures herein generally relate to devices for storing data.

BACKGROUND

Unless otherwise indicated herein, the approaches described in this section are not prior art to the claims in this application and are not admitted to be prior art by inclusion in this section.

A further increase in the storage capacity of memory devices gives rise to various technical problems as well as problems in application. For example, it may become increasingly difficult to achieve a high production yield of memory devices. In order to manufacture memory devices at reasonable cost, an increased proportion of error bits per device may have to be tolerated.

Further, increased storage capacity may mean that a faulty storage device may cause increased data loss and hence greater damage. In the case of a portable storage device, the theft of such a device may result in a greater risk of a security breach. It may be better to avoid localization of a vast amount of data in a single storage device.

SUMMARY

A device for storing data includes a sequence generator configured to generate a first number sequence that is a pseudorandom number sequence, a cross-correlation unit configured to produce a second number sequence that is a cross-correlation between the first number sequence and a third number sequence, and a write and read unit configured to write the second number sequence in memory and read the second number sequence from the memory, wherein the cross-correlation unit is further configured to reconstruct the third number sequence by obtaining a cross-correlation between the first number sequence and the second number sequence read from the memory.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIG. 6A is a drawing illustrating an example of a maximal length sequence.

DESCRIPTION OF EMBODIMENTS

Figure 1:
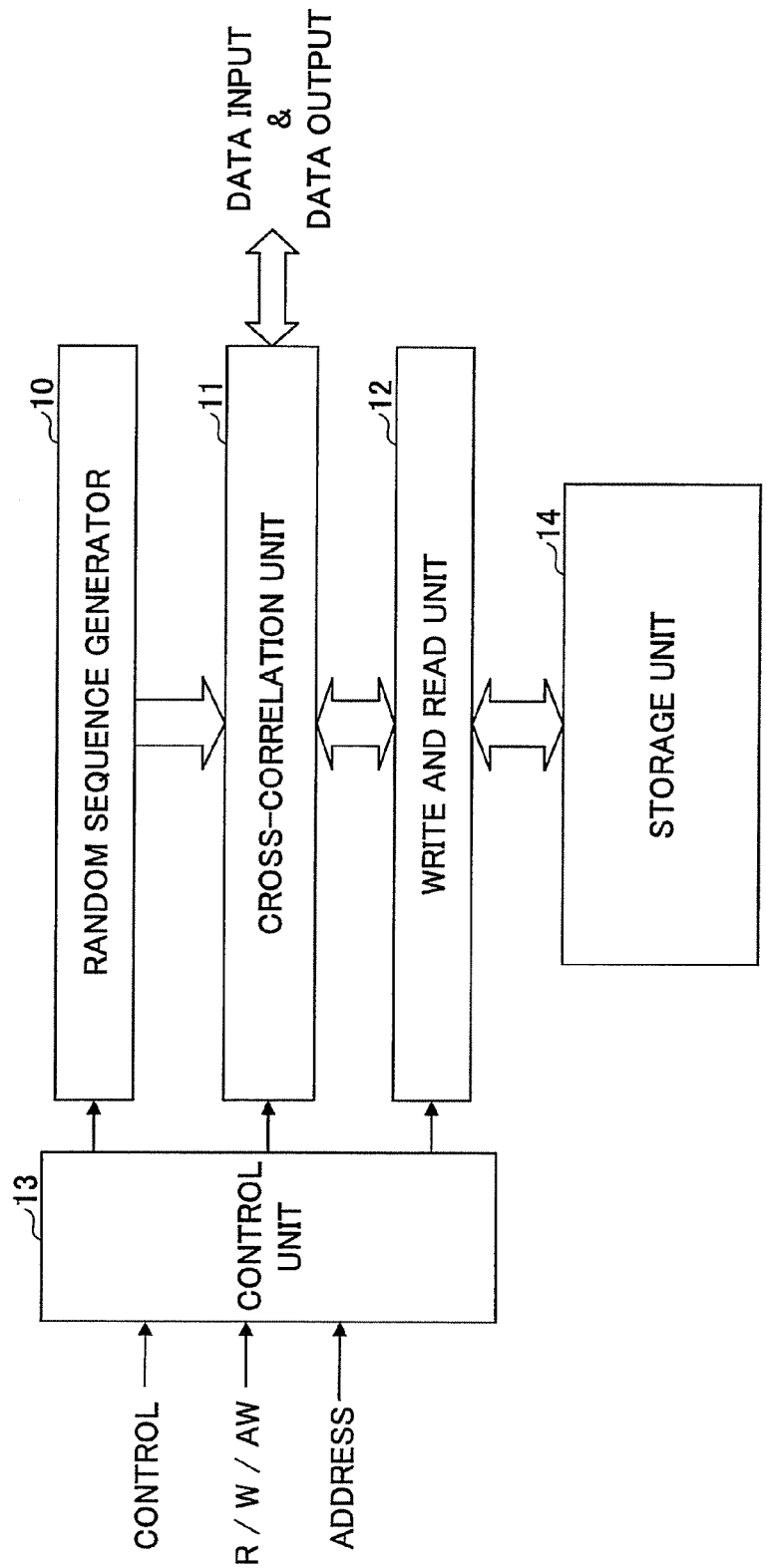
FIG. 1 is a drawing illustrating an example device for storing data according to one embodiment.

In the following, embodiments will be described in connection with the drawings.

The following description sets forth various examples along with specific details to provide a thorough understanding of claimed subject matter. It will be understood by those skilled in the art, however, that claimed subject matter may be practiced without some or more of the specific details disclosed herein. Further, in some circumstances, well-known methods, procedures, systems, components and/or circuits have not been described in detail in order to avoid unnecessarily obscuring claimed subject matter. In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the embodiments of the present disclosure, as generally described herein, and illustrated in the Figures, can be arranged, substituted, combined, and designed in a wide variety of different configurations, all of which are explicitly contemplated and make part of this disclosure.

FIG. 1 is a drawing illustrating an example of a device for storing data according to one embodiment. The configuration illustrated in FIG. 1 includes a random sequence generator 10, a cross-correlation unit 11, a write and read unit 12, a control unit 13, and a storage unit 14. The device for storing data may be part of a computer such as a data-I/O (i.e., data-input/output) interface unit, which may store data in the storage unit 14 that may be embedded in the computer or may be a separate data storage unit such as an external hard-disk drive, a USB flash drive, a memory card, a Compact Disk, a Digital Versatile Desk, etc. The device for storing data may be a portable storage unit separable from a host apparatus. In such a case, all the elements illustrated in FIG. 1 may be included in the device, which may be an external hard-disk drive, a USB flash drive, a memory card, etc.

The random sequence generator 10 may generate a first number sequence that may be a pseudorandom number sequence. The random sequence generator 10 may employ any random number generating method such as a linear congruential method, a mixed linear congruential method, a middle square method, a linear feedback shift register method, or the like, as long as the generated number sequence may exhibit a sufficiently sharp autocorrelation. That is, while the autocorrelation of the generated number sequence has a peak at the origin (i.e., zero shift), the values of the autocorrelation at the remaining points may be close to zero. Such an autocorrelation may make it possible to reconstruct number sequence as will be described later.

The cross-correlation unit 11 may produce a second number sequence that is a cross-correlation between the first number sequence and a third number sequence. The third number sequence may be an input number sequence supplied as a data input from an external source for storage in the storage unit 14. The write and read unit 12 may write the second number sequence to/in the storage unit 14 in a write operation. In a read operation, the write and read unit 12 may read the second number sequence from storage unit 14. In the read operation, the cross-correlation unit 11 may reconstruct the third number sequence by obtaining a cross-correlation between the first number sequence and the second number sequence read from the storage unit 14.

This cross-correlation for the read operation after the first cross-correlation for the write operation may serve to calculate an autocorrelation of the first number sequence, so that the reconstructed number sequence may become a cross-correlation between the data input sequence and the autocorrelation of the first number sequence. Since the first number sequence may be a pseudorandom number sequence whose autocorrelation may have a sharp peak like an impulse function (i.e., Dirac delta function), the cross-correlation between the data input sequence and the autocorrelation of the first number sequence during the read operation may serve to re-construct the data input sequence. This reconstruction process will be described later in detail.

In this method of storing data, information contained in the data input sequence (i.e., the third number sequence) may be spread and distributed as a longer, more redundant number sequence (i.e., the second number sequence) for storage in the storage unit 14. Even when part of the stored data may be corrupted or lost, the entire data input sequence may be reconstructed through the reconstruction process described above. Under some circumstances, as will be described in greater detail herein, the entire data input sequence may be reconstructed from a fraction of the stored number sequence. In the following, for the sake of convenience, this data storage scheme may be referred to as a "hologram memory" by taking analogy to the optical hologram. Further, data stored in the hologram memory may be referred to as holographic data.

The control unit 13 may control the operations of the random sequence generator 10, the cross-correlation unit 11, and the write and read unit 12. The control unit 13 may receive control data from an external source. The control data may specify the length and pattern of the first number sequence (i.e., pseudorandom number sequence) generated by the random sequence generator 10. For example, the random sequence generator 10 may be a shift register (i.e., linear feedback shift register) to generate a maximal length sequence, which may serve as the first number sequence. In such a case, the control unit 13 may control the random sequence generator 10 in accordance with the control data, so that at least one of one or more tap positions and a number of cascaded registers of the shift register effectively used to generate the maximal length sequence may be changed in the random sequence generator 10. Namely, the random sequence generator 10 may change the length and pattern of the first number sequence in response to the control data. In the case of a linear feedback shift register serving as the random sequence generator 10, the control unit 13 may set an initial state to the linear feedback shift register, such that the registers of the linear feedback shift register may not be set to all zeros in the initial state.

The control unit 13 may further receive, from the external source, data indicative of a read operation ("R"), a write operation ("W"), or an additional write operation ("AW") and address data indicative of a write/read start address. In the write operation, the control unit 13 may cause the cross-correlation unit 11 to convert the data input (i.e., the above-noted third number sequence) into a data sequence (i.e., the above-noted second number sequence) significantly longer than the data input sequence. The control unit 13 may then cause the write and read unit 12 to write the obtained second number sequence to the storage unit 14 by starting from the address specified by the externally supplied write address. The second number sequence may be a long number sequence, and may be stored at a large number of consecutive addresses in the storage unit 14.

In the read operation, the control unit 13 may cause the write and read unit 12 to read the second number sequence from the storage unit 14 by starting from the externally supplied read address. The second number sequence may be a long number sequence, and may be read successively from a large number of consecutive addresses in the storage unit 14. The control unit 13 may then cause the cross-correlation unit 11 to convert the second number sequence into a data sequence (i.e., the reconstructed data input sequence) significantly shorter than the second number sequence by calculating a cross-correlation between the second number sequence and the first number sequence generated by the random sequence generator 10. The second number sequence may be a cross-correlation between the first number sequence and the data input sequence (i.e., third number sequence), and may be cross-correlated again with the first number sequence upon data retrieval from the storage unit 14. The resulting number sequence may become a cross-correlation between the data input sequence and the autocorrelation of the first number sequence. Since the autocorrelation of the first number sequence may have a sharp peak, the cross-correlation between the data input sequence and the autocorrelation of the first number sequence during the read operation may serve to reconstruct the data input sequence.

In the additional write operation, the control unit 13 may cause the cross-correlation unit 11 to calculate a cross-correlation between a new data input and the first number sequence in the same manner as in the write operation. The write and read unit 12 may then produce a fourth number sequence by adding the second number sequence read from the storage unit 14 to a fifth number sequence produced by the cross-correlation unit 11 for the new data input. Further, the write and read unit 12 may write the fourth number sequence to the storage unit 14 to replace the second number sequence in the storage unit 14. This additional write operation will be described later in detail.

The control unit 13 may further coordinate data exchange timings between the random sequence generator 10, the cross-correlation unit 11, and the write and read unit 12 by supplying a clock signal and timing signals to the random sequence generator 10, the cross-correlation unit 11, and the write and read unit 12. In this manner, the control unit 13 may maintain synchronization between the random sequence generator 10, the cross-correlation unit 11, and the write and read unit 12. The random sequence generator 10 may produce a first number sequence that may be a long number sequence, and may supply numbers in this sequence successively to the cross-correlation unit 11. In the write operation, the cross-correlation unit 11 may start producing the second number sequence at proper timing relative to the first number sequence supplied from the random sequence generator 10. Then, the write and read unit 12 may start writing the second number sequence to the storage unit 14 at proper timing indicated by the control unit 13. In the additional write operation, the write and read unit 12 may start reading the second number sequence from the storage unit 14 at such proper timing as to match the timing of the fourth number sequence supplied from the cross-correlation unit 11. In the read operation, the write and read unit 12 may supply the second number sequence read from the storage unit 14 to the cross-correlation unit 11 at such proper timing as to match the timing of the first number sequence supplied from the random sequence generator 10 to the cross-correlation unit 11.

Figure 2:
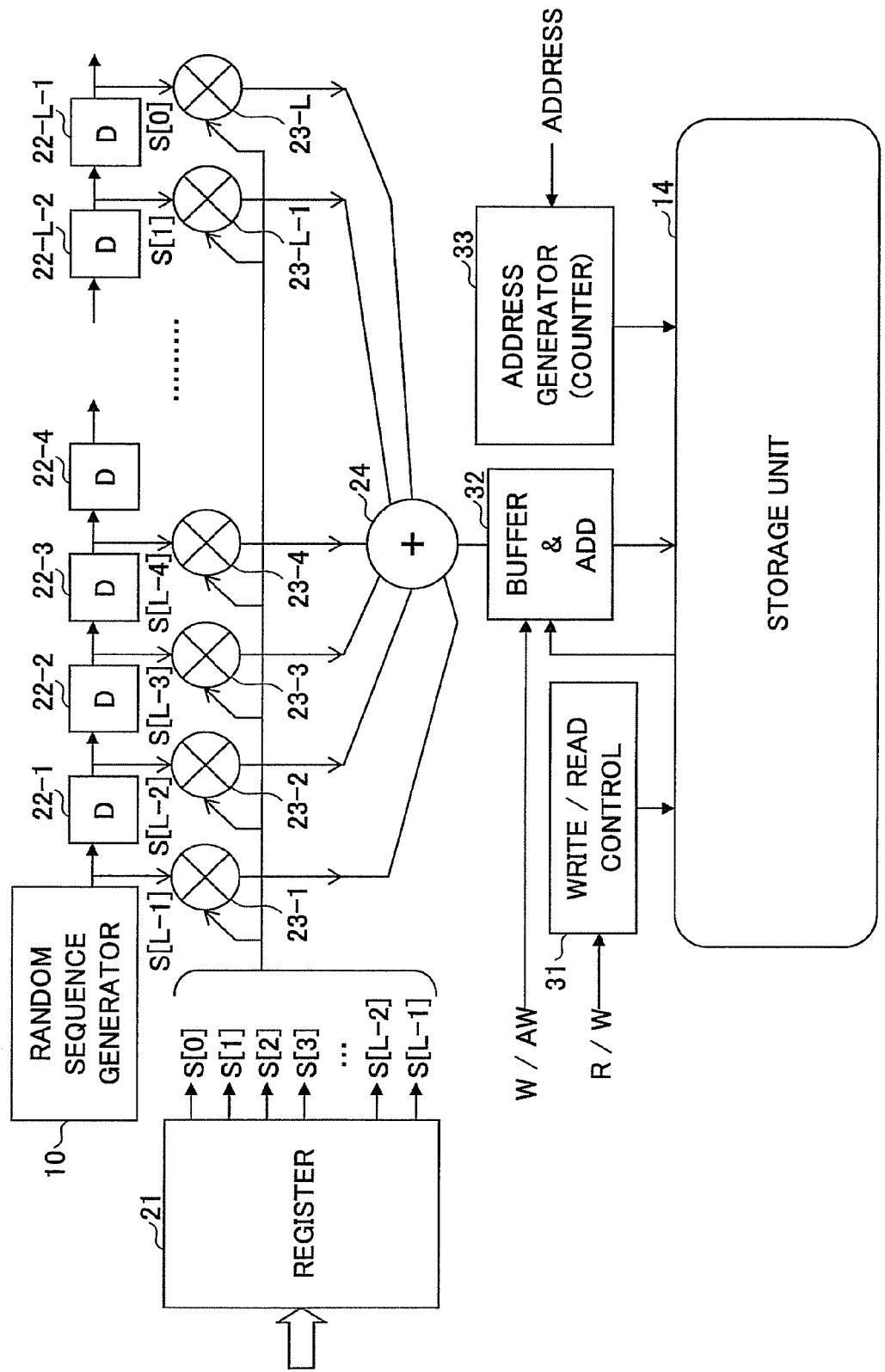
FIG. 2 is a drawing illustrating an example configuration of a cross-correlation unit and a write and read unit that relate to a write operation.

FIG. 2 is a drawing illustrating an example of the configuration of the cross-correlation unit 11 and the write and read unit 12 that relate to a write operation. In FIG. 2, the same elements as those of FIG. 1 are referred to by the same reference numbers, and a description thereof may be omitted.

The configuration illustrated in FIG. 2 may include, in addition to the random sequence generator 10 and the storage unit 14 already illustrated in FIG. 1, a register 21, a shift register comprised of cascade-connected registers 22-1 through 22-L−1, multiplying units 23-1 through 23-L, and an adding unit 24, which may constitute part of the cross-correlation unit 11. The configuration illustrated in FIG. 2 may further include a write/read control unit 31, a buffer-&-adder unit 32, and an address generator 33, which may constitute at least part of the write and read unit 12.

The register 21 may store the third number sequence (i.e., data input sequence) as a bit series S[0] through S[L−1]. The first number sequence produced by the random sequence generator 10 may be a bit sequence in this example. This bit sequence may shift through the cascade-connected registers 22-1 through 22-L−1 in synchronization with the clock signal supplied from the control unit 13. The multiplying units 23-2 through 23-L may perform bitwise multiplications of the bit series S[L−2] through S[0] stored in the register 21 by the bit series stored in the cascade-connected registers 22-1 through 22-L−1, respectively. The multiplying unit 23-1 may perform a multiplication of the bit S[L−1] stored in the register 21 by a bit directly output from the random sequence generator 10.

An additional register may be provided between the random sequence generator 10 and the register 22-1 so as to store the bit input into the multiplying unit 23-1. Alternatively, an internal register at the output stage of the random sequence generator 10 may be regarded as one of the cascade-connected registers. In such a case, it may be proper to say that the multiplying units 23-1 through 23-L may perform bitwise multiplication of the bit series S[L−1] through S[0] stored in the register 21 by a bit series stored in the cascade-connected registers, respectively. Further, the adding unit 24 may obtain a sum of all multiplied bits resulting from the bitwise multiplications.

The write/read control unit 31 may receive data indicative of the write operation "W" or the read operation "R" from the control unit 13 of FIG. 1, and may control the storage unit 14 to write data to or read data from the storage unit 14. This indication data from the control unit 13 may alternately indicate the read operation "R" and the write operation "W" during the additional write operation. The buffer-&-adder unit 32 may receive data indicative of the write operation "W" or the additional write operation "AW" from the control unit 13 of FIG. 1. In the case of the write operation, the buffer-&-adder unit 32 may supply the output data of the adding unit 24 as it is to the storage unit 14 for storage therein. Some data buffering in the buffer-&-adder unit 32 may be performed according to need. In the case of the additional write operation, the buffer-&-adder unit 32 may add data retrieved from the storage unit 14 to the output data of the adding unit 24, followed by supplying the resulting sum to the storage unit 14 for storage therein. This sum may replace the retrieved data in the storage unit 14.

The address generator 33 may receive the address data from the control unit 13 of FIG. 1, and serves as a counter to count up addresses starting from the address specified by the address data. In the write operation or additional write operation, therefore, successive write data may be stored at the successive addresses generated by the address generator 33 in the storage unit 14. In synchronization with each address increment by the address generator 33, the random sequence generator 10 may generate a new bit, and the bit series stored in the cascade-connected registers 22-1 through 22-L−1 may be shifted to the right. In the read operation, successive read data may be retrieved from the successive addresses generated by the address generator 33.

Figure 3:
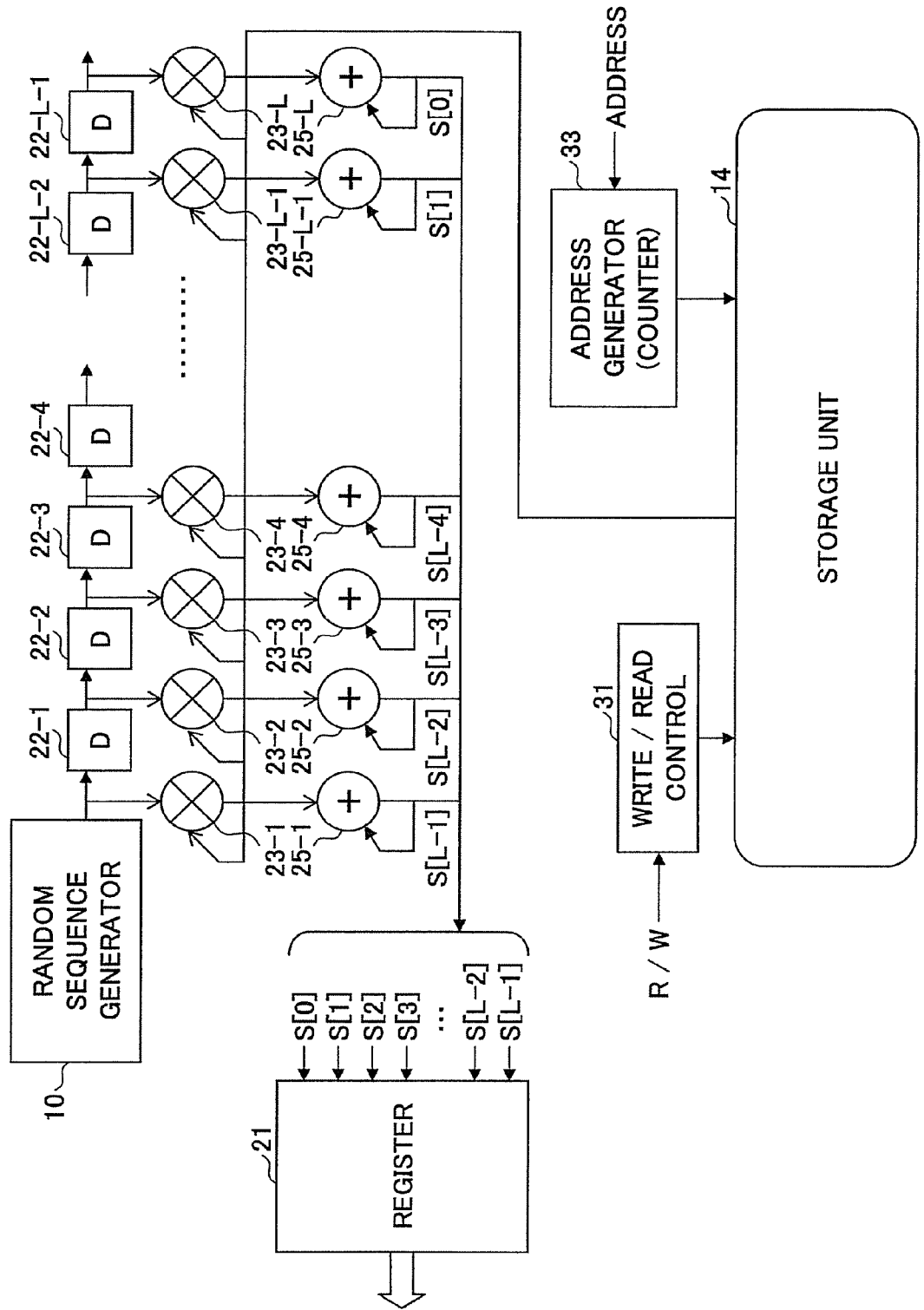
FIG. 3 is a drawing illustrating an example configuration of a cross-correlation unit and a write and read unit that relate to a read operation.

FIG. 3 is a drawing illustrating an example of the configuration of the cross-correlation unit 11 and the write and read unit 12 that relate to a read operation. In FIG. 3, the same elements as those of FIG. 2 are referred to by the same reference numbers, and a description thereof may be omitted.

The configuration illustrated in FIG. 3 may include, in addition to those already illustrated in FIG. 2, a plurality of adding units 25-1 through 25-L, which may be part of the cross-correlation unit 11. The multiplying units 23-1 through 23-L may receive different inputs than those in the case illustrated in FIG. 2. Switching of inputs between the configuration of FIG. 2 and the configuration of FIG. 3 may be performed by providing switches at the input nodes of the multiplying units 23-1 through 23-L. Alternatively, separate multiplying units may be provided for the configuration of FIG. 3 in addition to the multiplying units used in the configuration of FIG. 2.

The multiplying units 23-1 through 23-L may perform multiplications of respective bits stored in the shift registers (e.g., the cascade-connected registers 22-1 through 22-L−1 and one additional register in the random sequence generator 10) by a single number read from the storage unit 14. The adding units 25-1 through 25-L may be provided in one-toone correspondence to the plural products resulting from the multiplications. One of the adding units 25-1 through 25-L may produce a sum of a corresponding one of the plural products and an immediately preceding sum produced by the one of the adding units 25-1 through 25-L. That is, each adding unit may add its current output to its current input to produce an updated output.

Each time the outputs of the adding units 25-1 through 25-L may be obtained, next calculations start. That is, the write/read control unit 31 may read the next number from the storage unit 14. The random sequence generator 10 may generate the next bit, so that the bit sequence stored in the cascade-connected registers 22-1 through 22-L−1 may be shifted to the right by one bit. The multiplying units 23-1 through 23-L may perform multiplications, followed by the adding operations performed by the adding units 25-1 through 25-L. This may continue until the whole series of the second number sequence stored in the storage unit 14 may be read from the storage unit 14 and subjected to the multiplications by the multiplying units 23-1 through 23-L. After the whole series of the second number sequence may be read and subjected to the multiplications, the outputs of the adding units 25-L through 25-1 may be stored in the register 21 as a reconstructed bit series comprised of S[0] through S[L−1], respectively.

Figure 4:
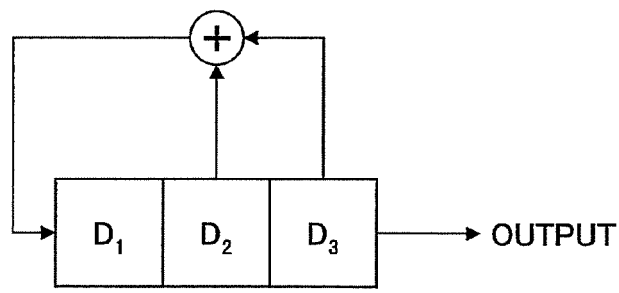
FIG. 4 is a drawing illustrating an example of a linear feedback shift register for producing a maximal length sequence.

FIG. 4 is a drawing illustrating an example of a linear feedback shift register for producing a maximal length sequence. A maximal length sequence generator may include one or more exclusive-OR gates and a shift register comprised of cascade-connected registers. Tap outputs from predetermined registers may be supplied to the exclusive OR gates, and the exclusive-OR sum of all the tap outputs may be fed back to the input of the first-stage register. In the example of FIG. 2, the tap outputs from the second and third registers may be supplied to an exclusive-OR gate. Which tap outputs may be used for feedback determines whether or not a given linear feedback shift register may generate a maximal length sequence.

The maximal length sequence generator comprised of N registers may generate a sequence of length $2^N-1$. The statistical characteristics of a maximal length sequence have been well studied. For the sake of convenience, the bit value "1" may be treated as "1", and the bit value "0" may be treated as "−1". The multiplication of "1" by "1" is "1", and the multiplication of "1" by "−1" is "−1", with the multiplication of "4" by "−1" is "1". With such an arrangement, the maximum autocorrelation value of "$2^N-1$" may be observed for a zero-bit shift while a one bit or greater phase shift results in an auto-correlation value of "−1".

Figure 5:
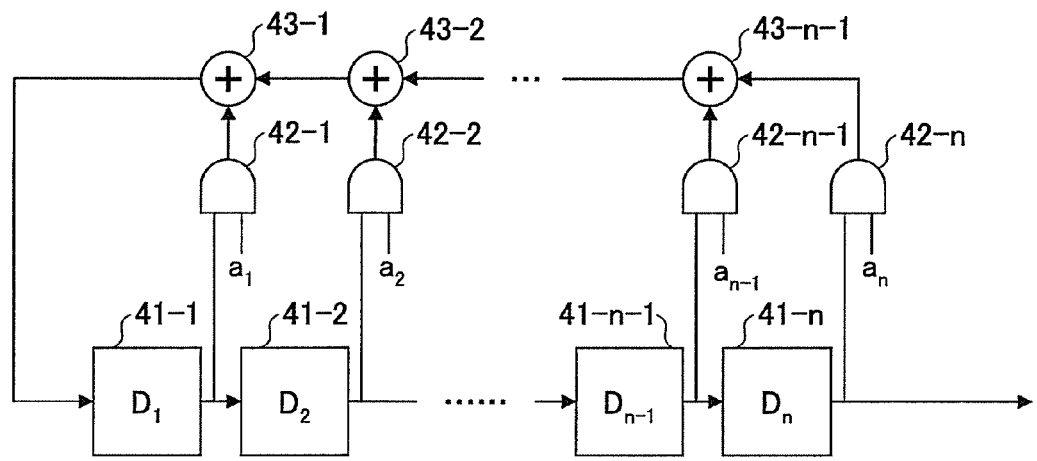
FIG. 5 is a drawing illustrating an example of the configuration of a linear feedback shift register with an adjustable length and pattern.

FIG. 5 is a drawing illustrating an example of the configuration of a linear feedback shift register with an adjustable length and pattern. The linear feedback shift register illustrated in FIG. 5 may include registers 41-1 through 41-n, AND gates 42-1 through 42-n, and exclusive-OR gates 43-1 through 43-n−1. The output of the register 41-i (i=1, 2, . . . , or n) may be applied to one of the two inputs of the AND gate 42-i. The other input of the AND gate 42-i may receive a coefficient $a_i$. The output of the AND gate 42-i may be supplied to the exclusive-OR gate 43-i.

Setting coefficients $a_1$ through $a_{n-1}$ to either "0" or "1" may make it possible to form a desired configuration of a linear feedback shift register. For example, setting $a_2$ and $a_3$ to "1" and all the remaining coefficients $a_1$ and $a_4$ through $a_{n-1}$ to "0" may make the maximal length sequence generator as illustrated in FIG. 4. The control unit 13 may set these coefficients to select tap positions and the number of cascaded registers effectively used to generate the maximal length sequence. In this manner, the random sequence generator 10 of FIG. 1 may change the length and pattern of the first number sequence in response to the control data. Although the linear feedback shift registers illustrated in FIG. 4 and FIG. 5 may be a linear feedback shift register in the Fibonacci configuration, a linear feedback shift register in the Galois configuration may alternatively be used.

In the following, a write operation and a read operation will be described in detail. A maximal length sequence having a length of $2^N-1$ bits may be represented as m[j] (j=0, 1, 2, 3, . . . , $2^N-2$). The data input sequence may be represented as S[i] (i=0, 1, 2, . . . , L−1). Each element of these sequences may be either "1" or "−1" as previously described. The data store sequence M[j] (j=0, 1, 2, 3, . . . , $2^N-2$)" may be expressed as follows.

[Math. 1]

$$M[j] = S[0]m[j] + S[1]m[j+1] + \ldots + S[L-1]m[j+L-1] \quad (1)$$
$$= \sum_{i=0}^{L-1} S[i]m[i+j]$$

This is a cross-correlation between m[0] through m[$2^N-2$] and S[0] through S[L−1]. It should be noted that the maximal length sequence may be cyclic, which means that the last number m[$2^N-2$] may be followed by another series of m[1] through m[$2^N-2$].

The cross-correlation expressed by the above formula (1) for a given j may be calculated in parallel in a single clock cycle by the configuration illustrated in FIG. 2. In this case, the multiplying units 23-1 through 23-L may be implemented as exclusive-NOR gates. An exclusive-NOR gates may produce "1" when the two inputs are the same, and may produce "0" when the two inputs are different from each other. In the configuration of FIG. 2, m[j] and S[i] may assume either "0" or "1" in the same manner as in a typical bit sequence, so that exclusive-NOR gates serving as the multiplying units 23-1 through 23-L may produce products that may be either "0" or "1". The adding unit 24 may be configured such that a summation of 0s and 1s may be calculated by treating an input value of "0" as "−1" and an input value of "1" as "1". The resulting sum may be equal to the sum that would be obtained by using m[j] and S[i] that assume either "−1" or "1" from the beginning.

Further, it may be noted that L may be smaller than $2^N-1$, so that data having a length of L may be spread over data having a length of $2^N-1$. Since L may be smaller than $2^N-1$, the value of M[j] for any j may be at least within a range of $-(2^N-1)$ to $2^N-1$. The cross-correlation calculated in this manner may be stored in a memory device having at least an N-bit word width.

When part of the data input sequence S[0] through S[L−1] may be changed, only the difference may be stored in the storage unit 14. For example, if only S[1] is changed to S'[1], a cross-correlation between "m[0], m[1], . . . , m[$2^N-2$]" and "0, S'[1]-S[1], 0, . . . , 0" may be calculated. Then, this cross-correlation may be added to the cross-correlation between m[0] through m[$2^N-2$] and S[0] through S[L−1] that may be already stored in the storage unit 14. The result of this adding operation may be stored in the storage unit 14 to replace the original cross-correlation. This may correspond to the additional write operation "AW" which was previously described.

The additional write operation "AW" may be not only used to write a change made to the original data input sequence, but also used to write an additional data input sequence. For example, a cross-correlation between m[0] through m[$2^N$-2] and S[0] through S[2L-1] in which S[0] through S[L-1] may be all set equal to zero may be additionally written to the storage unit 14 by using the same maximal length sequence m[0] through m[$2^N$-2] as that used for writing the original sequence S[0] through S[L-1]. Such an additional write operation may result in storing the data input sequence S[0] through S[2L-1], i.e., the original sequence S[0] through S[L-1] and the additional sequence S[L] through S[2L-1] together as one sequence.

Further, the additional write operation "AW" may not only use the same maximal length sequence, but also use a different maximal length sequence to write a new data input sequence. For example, a cross-correlation between m'[0] through m'[$2^N$-2] and a new input sequence S'[0] through S'[L-1] may be additionally written to the storage unit 14 wherein the maximal length sequence m[0] through m[$2^N$-2] may be different from the maximal length sequence m[0] through m[$2^N$-2] used for writing the input sequence S[0] through S[L-1]. Such an additional write operation may result in storing the new sequence S'[0] through S'[L-1] in addition to the sequence S[0] through S[L-1] at the same memory locations. Since a cross-correlation between m[0] through m[$2^N$-2] and m'[0] through m'[$2^N$-2] may not have a sharp peak, a reconstruction process can still reconstruct the two data input sequences separately from each other. Such different maximal length sequences may be generated by changing tap positions. In order to delete one of the data store sequences, this data store sequence may be subtracted from the values stored in the storage unit 14.

The reconstructed data sequence O[0] through O[$2^N$-2] may be represented as follows.

[Math. 2]

$$O[k] = \sum_{j=0}^{2^N-2} M[j]m[j+k] \quad (2)$$

For example, O[0] may be calculated as follows.

[Math. 3]

$$O[0] = \sum_{j=0}^{2^N-2} M[j]m[j]$$

$$= \sum_{j=0}^{2^N-2} \sum_{i=0}^{L-1} S[i]m[i+j]m[j]$$

$$= S[0]\sum_{j=0}^{2^N-2} m[j]m[j] + S[1]\sum_{j=0}^{2^N-2} m[1+j]m[j] + \ldots + S[L-1] \sum_{j=0}^{2^N-2} m[L-1+j]m[j]$$

Here, the summation of m[i+j]m[j] appearing in the above expression is equal to $2^N$-1 for i=0 and equal to -1 for i<>0. O[0] may be thus expressed as follows.

O[0]=($2^N$-1)S[0]-(S[1]+S[2]+ ... +S[L-1])

By the same taken, for any given k between 0 and L-1, O[k] may be represented as:

O[k]=($2^N$-1)S[k]-(S[0]+S[1]+ ... +S[L-1]-S[k]).

For any given k larger than L-1, O[k] may be represented as:

O[k]=-S[0]-S[1]- ... -S[L-1].

Since L may be smaller than $2^N$-1, the use of proper threshold values may make it possible to reconstruct O[k] without error.

Figure 6A:
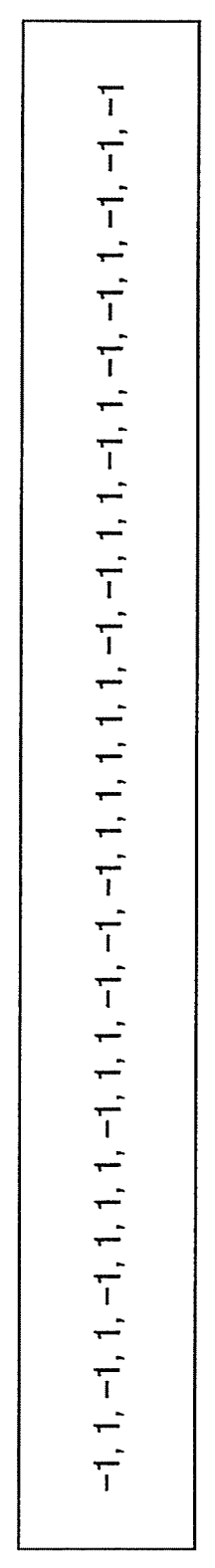
Figure 6B:
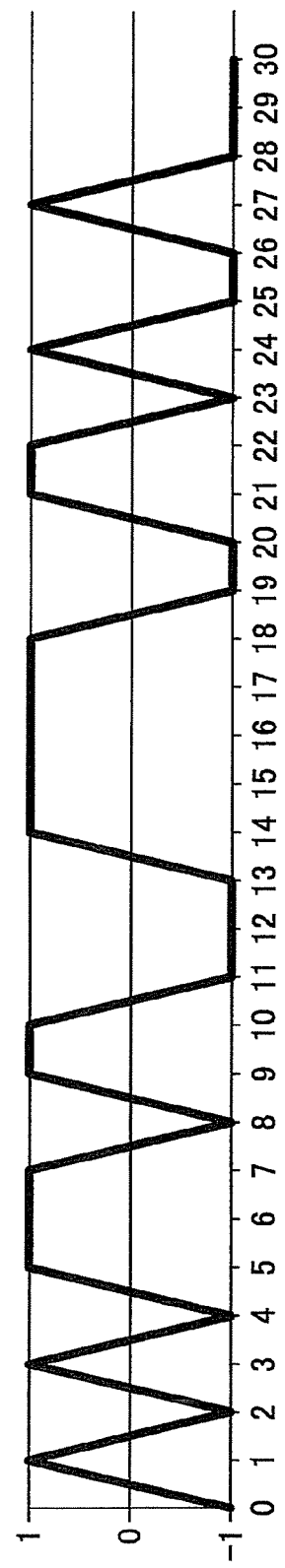
FIG. 6B is a drawing illustrating an example of a maximal length sequence.
Figure 6C:
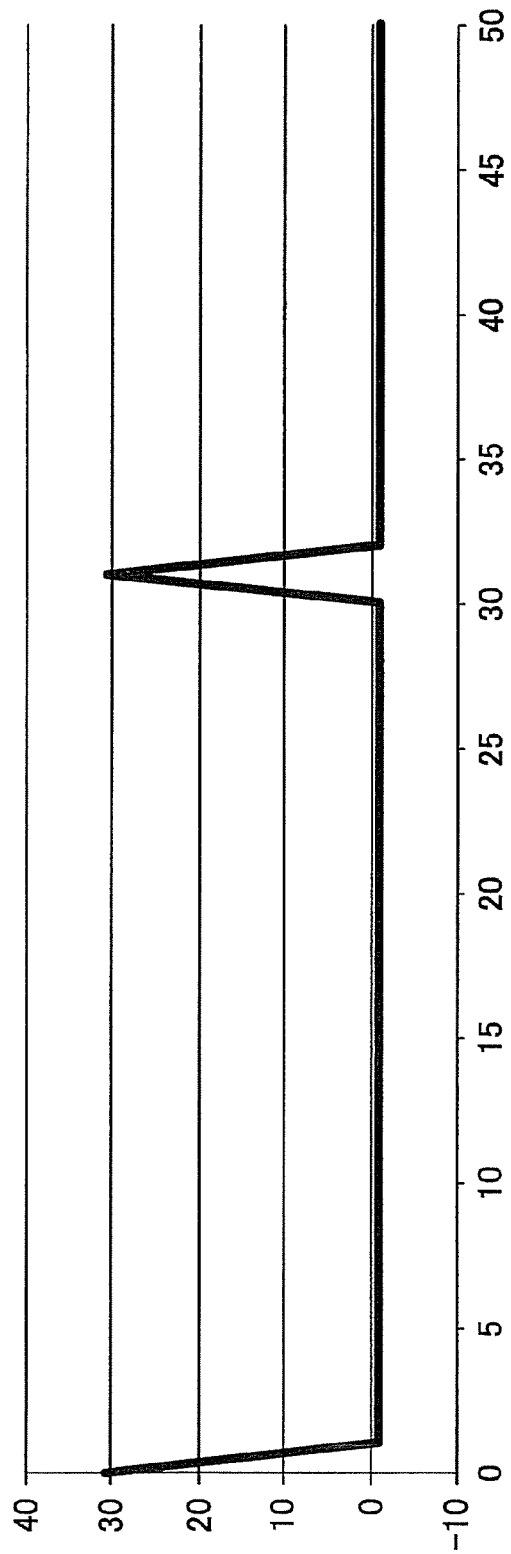
FIG. 6C is a drawing illustrating an example of a maximal length sequence.

FIGS. 6A through 6C are drawings illustrating an actual example of a maximal length sequence. When the number of registers of a linear feedback shift register is 5, the use of the second tap output and the fifth tap output for feedback may generate a maximal length sequence having a length of 31. FIG. 6A illustrates the maximal length sequence generated by such a linear feedback shift register. In this representation, "1" is shown as "1" and "0" is shown as "-1". FIG. 6B illustrates the maximal length sequence in a graph chart. The horizontal axis represents a sequence number, and the vertical axis represents a bit value of either "-1" or "1". FIG. 6C illustrates an autocorrelation of the maximal length sequence. As is illustrated, the autocorrelation has a maximum value at a zero-shift point, which corresponds to the origin and to every $32^{nd}$ sequence position. The value of the peak is 31, and the values at the remaining points are -1.

Figure 7A:
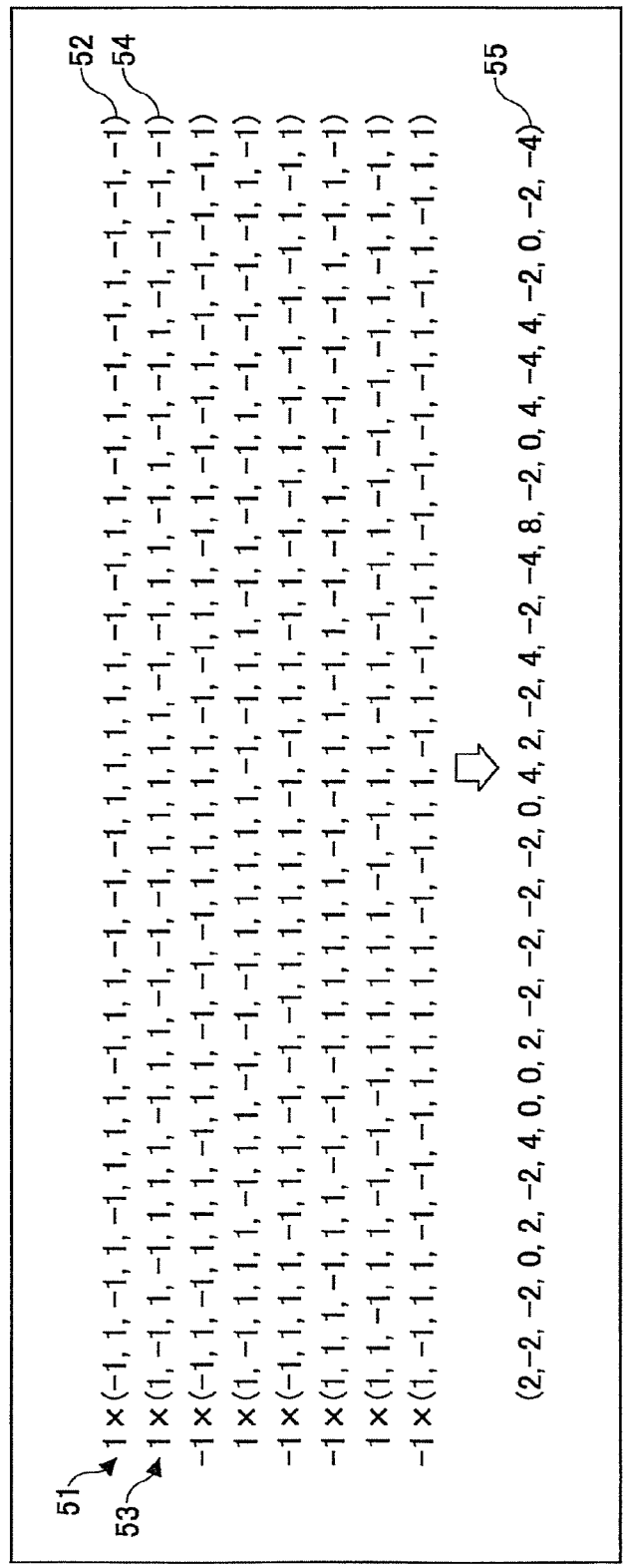
FIG. 7A is a drawing schematically illustrating an example calculation of a cross-correlation.
Figure 7B:
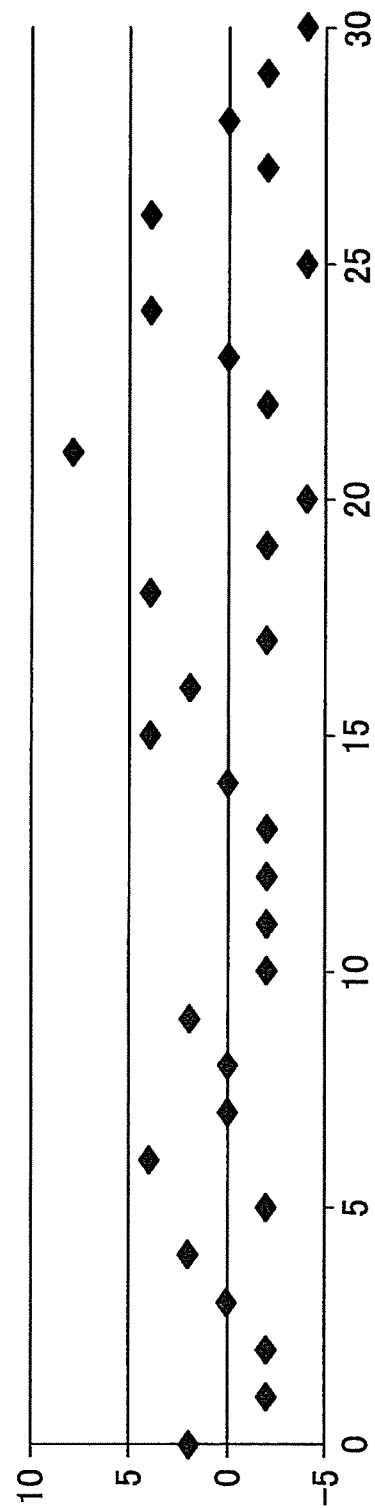
FIG. 7B is a drawing illustrating the example cross-correlation of FIG. 7A in a graph chart.

FIG. 7A is a drawing schematically illustrating the calculation of a cross-correlation. In this example, the maximal length sequence illustrated in FIG. 6A and FIG. 6B is used to spread a data input sequence (1, 1, -1, 1, -1, -1, 1, -1). In FIG. 7A, a leftmost digit 51 on the first row may be the first number of the data input sequence. A number sequence 52 on the first row may be the maximal length sequence illustrated in FIG. 6A. A leftmost digit 53 on the second row may be the second number of the data input sequence. A number sequence 54 on the second row may be the maximal length sequence illustrated in FIG. 6A as shifted to the left by one bit. In the same manner, a leftmost digit on the i-th row may be the i-th number of the data input sequence, and the maximal length sequence shifted to the left by i bits may be illustrated on the i-th row. Each element of the maximal length sequence in a given row may be multiplied by the leftmost digit of the same row. Resulting number sequences may be added up in a bitwise manner to produce a cross-correlation 55 illustrated at the bottom. FIG. 7B illustrates the cross-correlation in a graph chart. The horizontal axis represents a sequence number, and the vertical axis represents cross-correlation values. These values of the cross-correlation may be stored in the memory (i.e., the storage unit 14) as holographic data.

Figure 8:
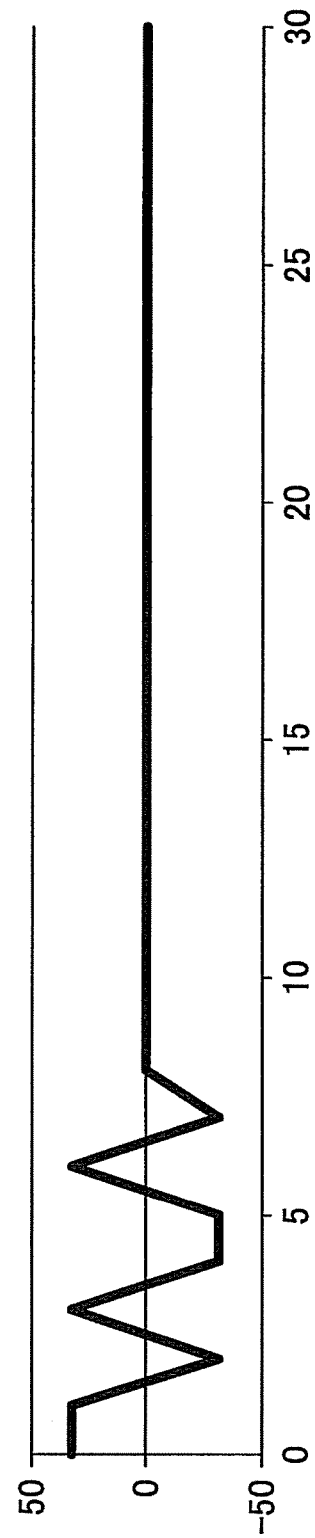
FIG. 8 is a drawing illustrating an example of a cross-correlation calculated at the time of a read operation.

FIG. 8 is a drawing illustrating an example of a cross-correlation calculated at the time of a read operation. The maximal length sequence illustrated in FIG. 6B may be cross-correlated with the holographic data illustrated in FIG. 7B. The resulting number sequence is illustrated in FIG. 8. As is illustrated, the resulting number sequence has a large positive value around "+30", a large negative value around "-30", or an intermediate value close to zero. A first threshold value may be set at a midpoint between 0 and 30, and a second threshold value may be set at a midpoint between 0 and -30. By comparing the resulting number sequence with these two threshold values, it may be possible to reconstruct the data input sequence. As can be seen in FIG. 8, the eight leftmost numbers of the resulting number sequence correspond to the eight digits of the data input sequence (1, 1, -1, 1, -1, -1, 1, −1). In this manner, the data input sequence may be reconstructed by calculating a cross-correlation at the time of a read operation.

Figure 9A:
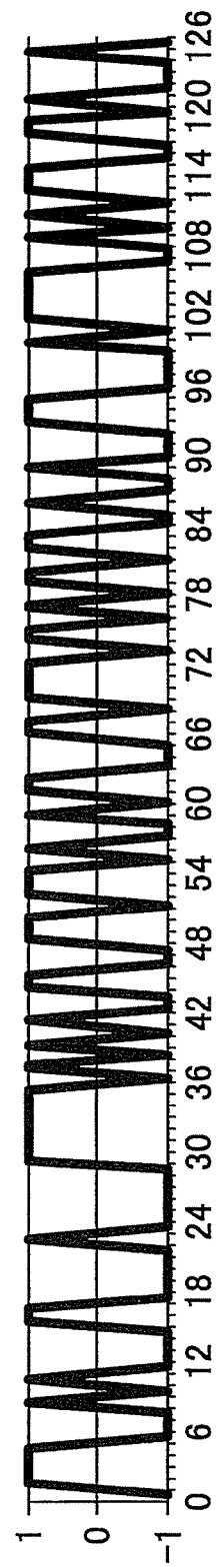
FIG. 9A is a drawing illustrating another example of a maximal length sequence.
Figure 9B:
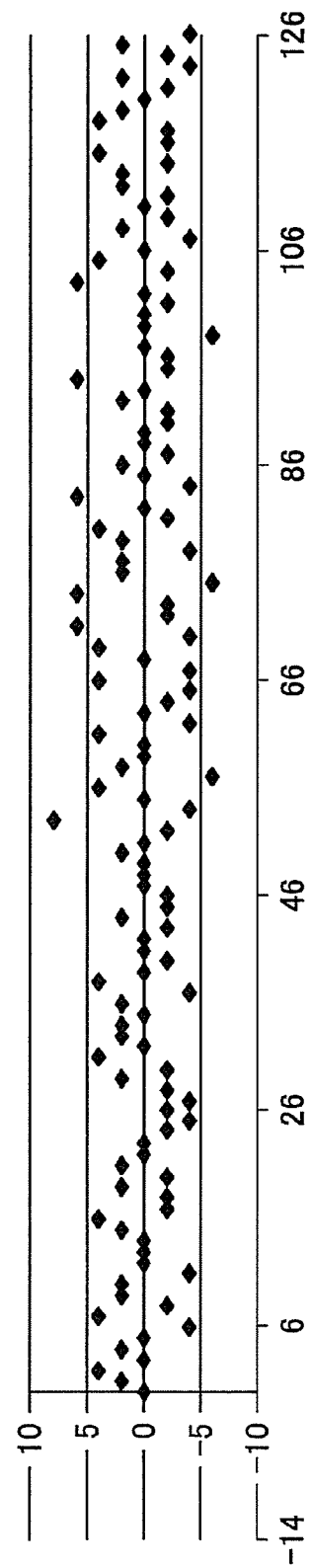
FIG. 9B is a drawing illustrating another example of a maximal length sequence.

FIGS. 9A and 9B are drawings illustrating another actual example of a maximal length sequence. FIG. 9A illustrates a maximal length sequence generated by a linear feedback shift register comprised of 7 registers. The horizontal axis represents a sequence number, and the vertical axis represents a bit value of either "−1" or "1". In this case, a sequence length is 127 ($=2^7-1$). FIG. 9B illustrates a cross-correlation obtained when the maximal length sequence illustrated in FIG. 9A is used to spread a data input sequence (1, 1, −1, 1, −1, −1, 1, −1). The horizontal axis represents a sequence number, and the vertical axis represents cross-correlation values. These values of the cross-correlation may be stored in the memory (i.e., the storage unit 14) as holographic data.

Figure 10A:
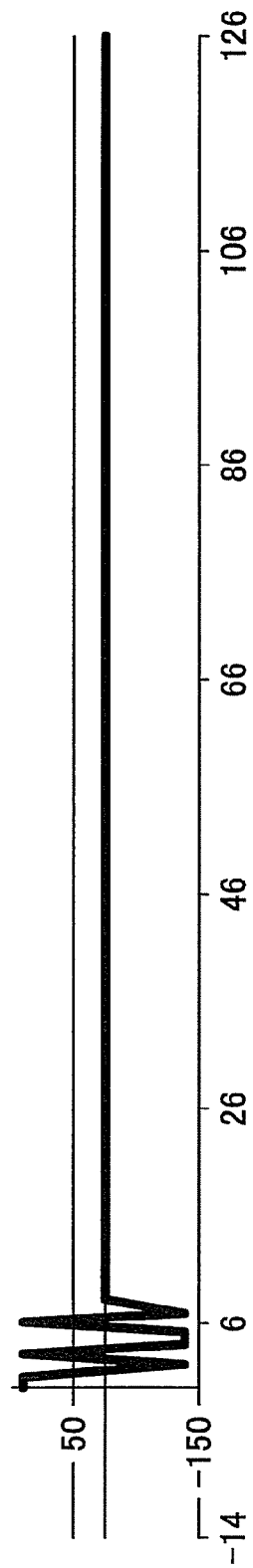
FIG. 10A is a drawing illustrating examples of a cross-correlation calculated at the time of a read operation.
Figure 10B:
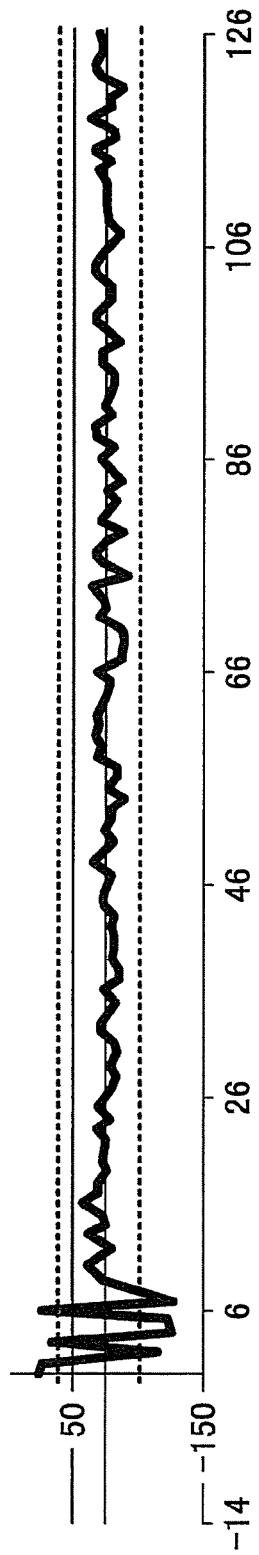
FIG. 10B is a drawing illustrating examples of a cross-correlation calculated at the time of a read operation.
Figure 10C:
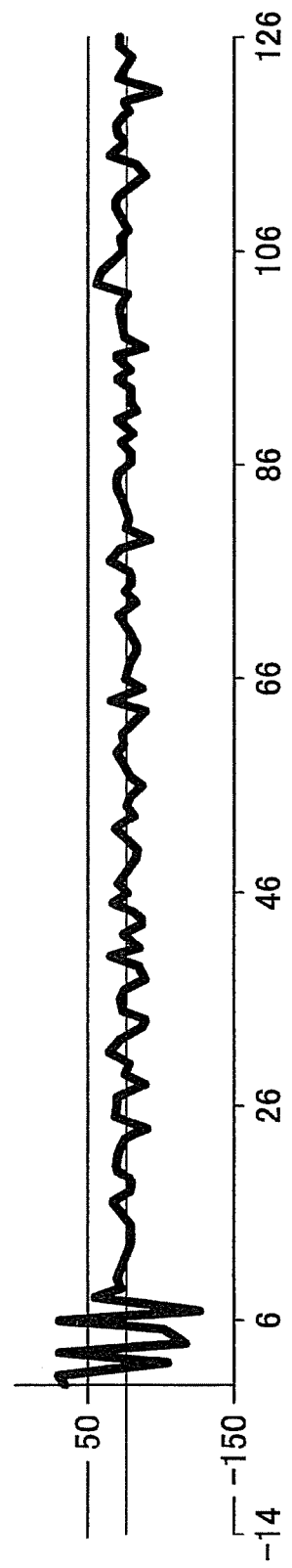
FIG. 10C is a drawing illustrating examples of a cross-correlation calculated at the time of a read operation.

FIGS. 10A through 10C are drawings illustrating examples of a cross-correlation calculated at the time of a read operation. The maximal length sequence illustrated in FIG. 9A is cross-correlated with the holographic data illustrated in FIG. 9B. The resulting number sequence is illustrated in FIG. 10A. The eight leftmost numbers of the resulting number sequence correspond to the eight digits of the data input sequence (1, 1, −1, 1, −1, −1, 1, −1). In this manner, the data input sequence may be reconstructed by calculating a cross-correlation at the time of a read operation.

FIG. 10B illustrates a case in which data is lost (i.e., set to "0" in this example) at 40 data points among the 127 total data points. In this case, the number sequence obtained by calculating a cross-correlation at the time of a read operation may contain errors as illustrated in FIG. 10B. With the use of proper threshold values as indicated by dotted lines, it may be sill possible to reconstruct the data input sequence (1, 1, −1, 1, −1, −1, 1, −1).

FIG. 10C illustrates a case in which data is lost (i.e., set to "0" in this example) at 80 data points among the 127 total data points. This case may be a threshold case in which the data input sequence (1, 1, −1, 1, −1, −1, 1, −1) can still be reconstructed with the use of proper threshold values.

In the hologram memory, information contained in the data input sequence may be spread and distributed over a long data store sequence in a redundant manner. As was previously described, the expression "hologram memory" is used only for the sake of convenience by taking analogy to the optical hologram. This expression is by no means intended to limit the scope of the present disclosure. As the length of the data store sequence increases, the redundancy may increase. In other words, the larger the ratio of the length of a maximal length sequence to the length of a data input sequence, the more robust the hologram memory may be. For example, a linear feedback shift register comprised of 15 registers may generate a maximal length sequence that is 32,767-bit long. When a data input sequence having a length of 273 bits was stored in the hologram memory by using this maximal length sequence, data reconstruction was possible even when 98.5% of the data points were destroyed.

Figure 11:
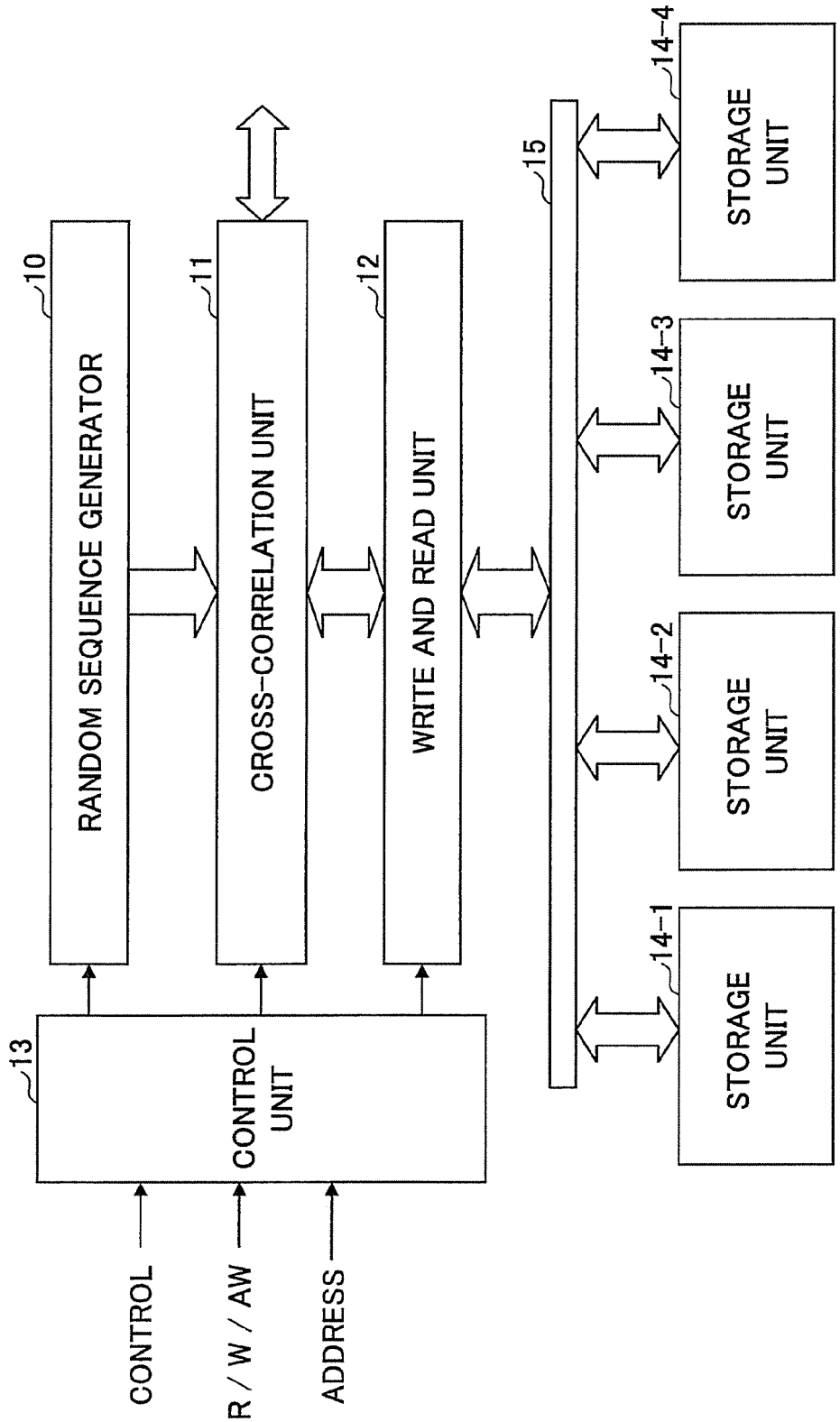
FIG. 11 is a drawing illustrating an example device for storing data.

FIG. 11 is a drawing illustrating a variation of the device for storing data illustrated in FIG. 1. In FIG. 11, the same elements as those of FIG. 2 are referred to by the same reference numbers, and a description thereof may be omitted. In FIG. 11, the storage system may include a plurality of storage units 14-1 through 14-4. The number of the storage units 14-1 through 14-4 is four in the configuration illustrated in FIG. 11 as a non-limiting example. The number of storage units may be any number, which may be chosen by considering various factors.

The write and read unit 12 may write a first part of the data store sequence (i.e., second number sequence) in the storage unit 14-1, for example, and may write a second part of the data store sequence in the storage unit 14-2, for example. In this manner, the data store sequence may be distributed over a plurality of storage devices situated at respective locations. The storage units 14-1 through 14-4 may be connected to the write and read unit 12 through a network 15. In such a case, the write and read unit 12 may transmit the first part of the data store sequence and the second part of the data store sequence to the network 15 through which the storage units 14-1 through 14-4 may be reached. The network 15 may be an Intranet, the Internet, or any type of network that can have storage devices at different locations accessible from a single location.

Figure 12:
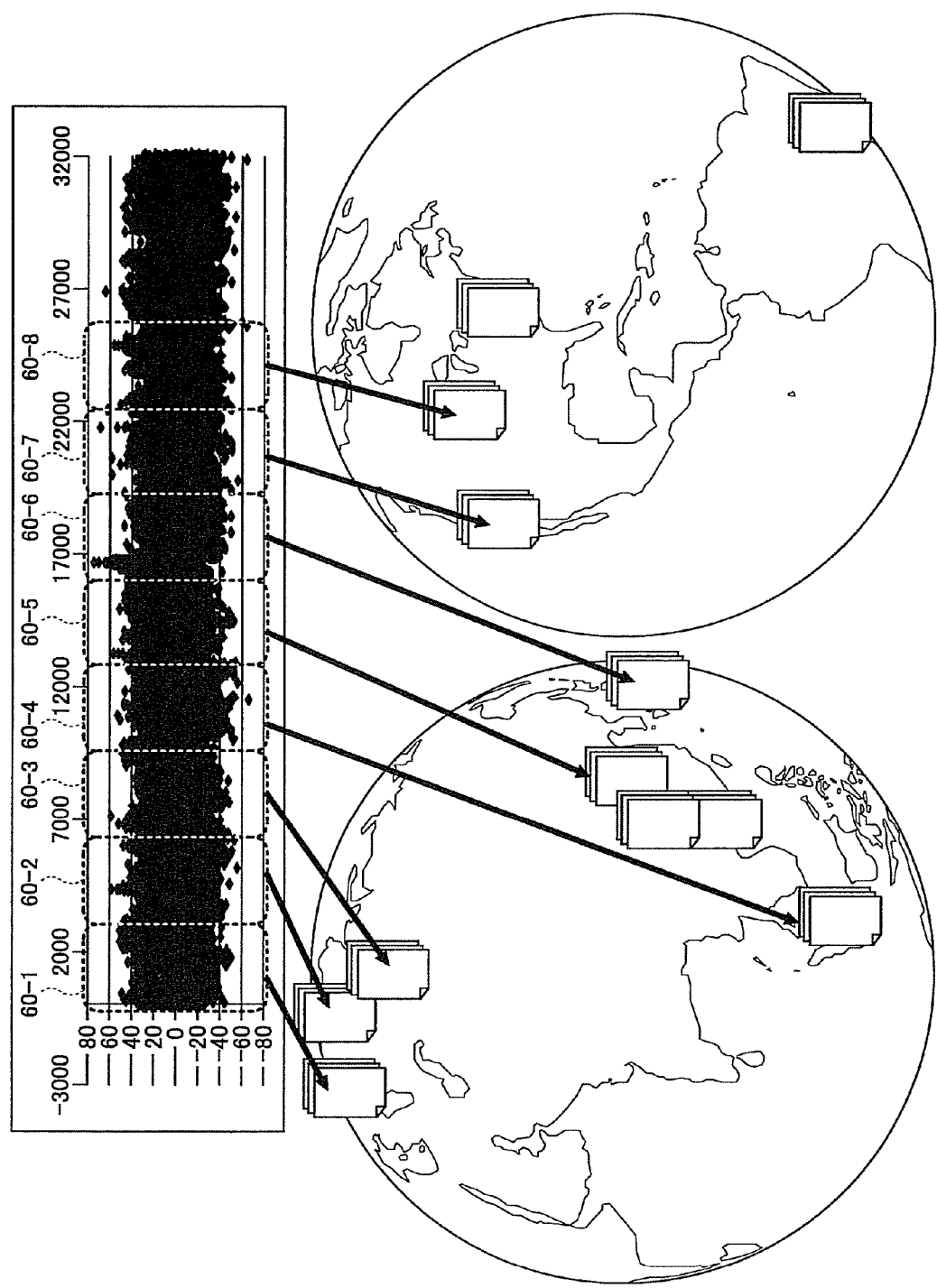
FIG. 12 is an illustrative diagram showing an example of the use of plural storage devices to store holographic data.

FIG. 12 is an illustrative diagram showing the use of plural storage devices around the world to store holographic data. As was previously described, the expression "holographic data" is used only for the sake of convenience by taking analogy to the optical hologram. This expression is by no means intended to limit the scope of the present disclosure. In FIG. 12, the holographic data may include data blocks 60-1 through 60-8. These data blocks 60-1 through 60-8 may be sent through the Internet, for example, to respective data centers for storage therein. The data centers may be scattered around the world. Even if data is stolen from any one of the data centers, the maximal length sequence that has been used to create the holographic data may not be known. Such a maximal length sequence may be difficult to identify since the number of possible maximal length sequences may be astronomical. Further, the data blocks may be provided as only a fraction of the whole holographic data to prevent data reconstruction from one data block. In such a case, even if the maximal length sequence is identified, the entire data cannot be reconstructed from only the stolen part of data. Moreover, even if part of the holographic data is destroyed by a terrorist attack, fire, a virus attack, a natural disaster, or the like, the original data can be restored from the remaining data.

Figure 13:
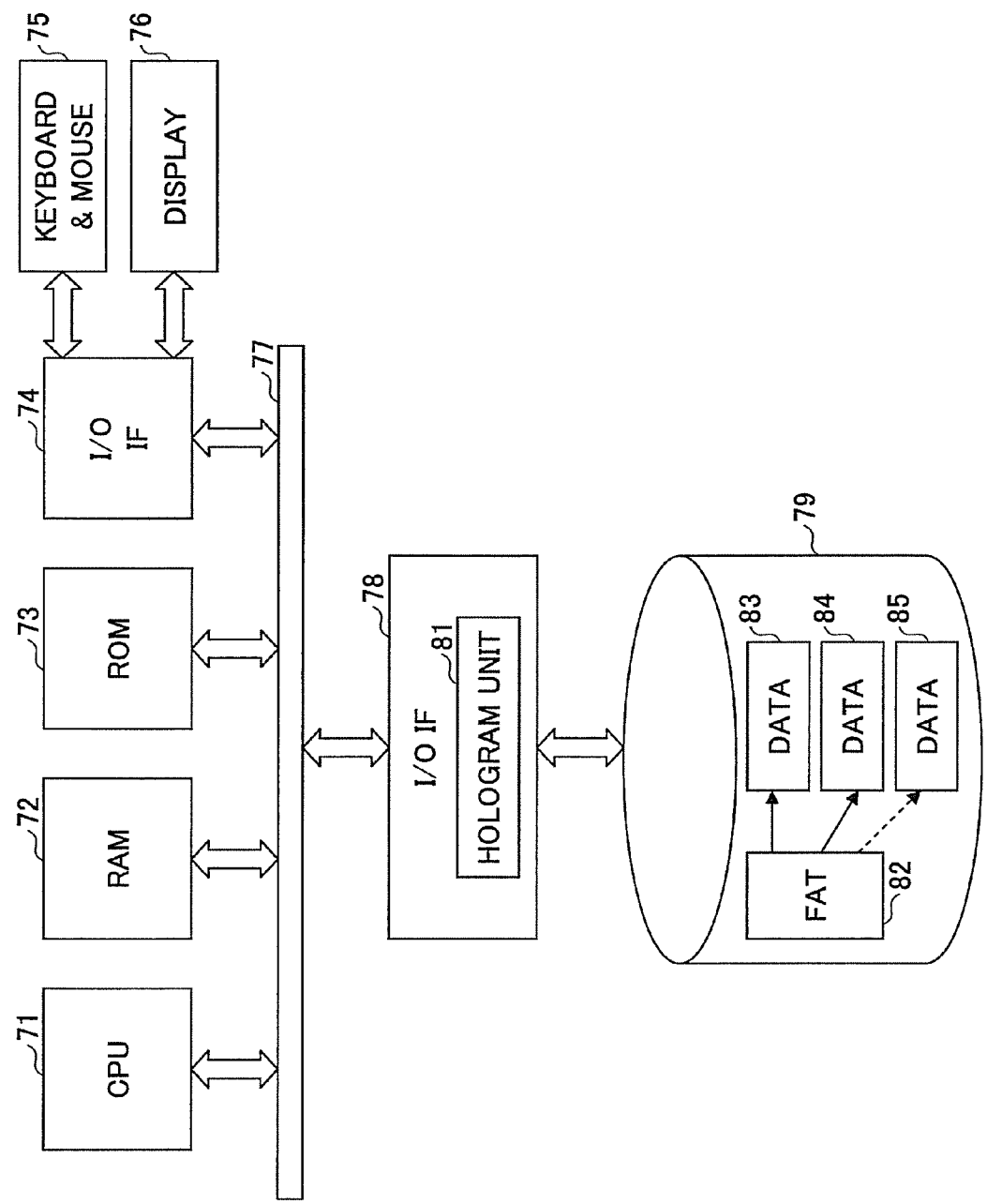
FIG. 13 is a drawing illustrating an example computer system that utilizes a hologram memory.

FIG. 13 is a drawing illustrating an example of a compute system that utilizes a hologram memory. The computer system illustrated in FIG. 13 may include a CPU 71, a RAM 72, a ROM 73, an IO I/F (i.e., input-output interface) 74, a keyboard and mouse 75, a display 76, a bus 77, an IO I/F 78, and a hard-disk drive 79. The keyboard and mouse 75 may provide user interface, and may receive various commands for operating the computer system and user responses responding to data requests or the like. The display 76 may be a liquid crystal display or the like. The display 76 may display the results of processing performed by the computer system. The display 76 may also display various data that make it possible for the user to communicate with the computer system. The hard-disk drive 79 is only an example of a storage device, and may instead be other type of storage device such as a USB flash drive, a memory card, a disk drive for a Compact Disk, a Digital Versatile Desk, etc.

A computer program used for creating and storing holographic data in the hard-disk drive 79 may be provided in the hard-disk drive 79. Upon user instruction for program execution entered through the keyboard and mouse 75, the CPU 71 may load the program to the RAM 72 from the hard-disk drive 79. The CPU 71 may execute the program loaded to the RAM 72 by using an available memory space of the RAM 72 as a work area, and may continue processing while communicating with the user as such a need arises. The ROM 73 may store therein control programs for the purpose of controlling basic operations of the computer system.

The I/O IF 78 may include a hologram unit 81, which corresponds to the random sequence generator 10, the cross-correlation unit 11, the write and read unit 12, and the control unit 13 illustrated in FIG. 1. Even if the hologram unit 81 is not provided, hologram data may be generated by the CPU 71, which may generate a random number sequence such as a maximal length sequence through computation and calculates a cross-correlation. Holographic data generated by the hologram unit 81 or the CPU 71 may be stored in the hard-disk drive 79.

Figure 14:
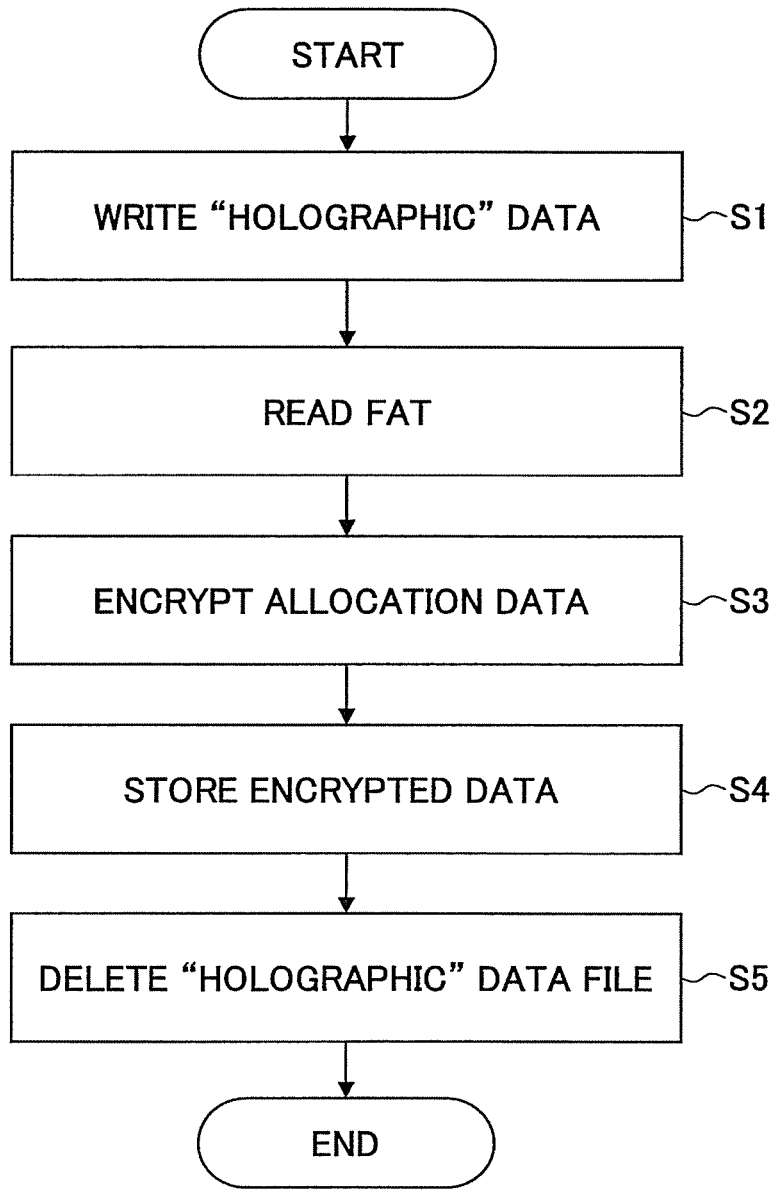
FIG. 14 is a flowchart illustrating an example process for storing holographic data in a secure manner.

FIG. 14 is a flowchart illustrating a process of storing holographic data in a secure manner. In step S1, the CPU 71 may store holographic data 85 in the hard-disk drive 79 through the I/O IF 78. The holographic data 85 may be stored as a data file that may be managed under the control of an operating system using a FAT (File Allocation Table) 82. In step S2, the CPU 71 may read the FAT entry of the holographic data 85 from the FAT 82 of the hard-disk drive 79 through the I/O IF 78. The FAT entry of the holographic data 85 may indicate cluster positions where the holographic data 85 may be stored. A FAT used in this configuration is a non-limiting example, and another type of index may be used in place of the FAT.

In step S3, the FAT entry of the holographic data 85 may be encrypted by the CPU 71 using an encryption process. Any type of encryption process may be used as long as it may provide sufficient security. In step S4, the CPU 71 may store the encrypted FAT entry in the hard-disk drive 79 through the I/O IF 78. In step S4, the CPU 71 may delete the holographic data file that may be created in step S1. Namely, the operating system may delete the FAT entry of the holographic data 85 in the FAT 82, but may not delete the holographic data 85 at this point in time. After this, the FAT 82 may indicate cluster positions of other data 83 and 84, but may not indicate the cluster positions of the holographic data 85.

In the example described above, the FAT entry of the holographic data 85 in the FAT 82 may be deleted after writing the holographic data 85. Alternatively, the holographic data 85 may be written to the hard-disk drive 79 without making a corresponding entry in the FAT. Namely, the holographic data 85 may be stored by using a special write command, system call, or the like, such that the holographic data file may not be created under the file system utilizing the FAT 82. When writing the holographic data in this manner, the FAT may still be accessed to ensure that the storage areas to be used for storing the holographic data may not be currently used by the operating system.

After the process illustrated in FIG. 14, there may be no straightforward means to access the holographic data 85 because the holographic data file may not be in existence. Since the operating system may not recognize the existence of the holographic data 85, the operating system may overwrite some storage areas of the hard-disk drive 79 where the holographic data 85 may be stored. Such an overwrite operation may destroy part of the holographic data 85. After the passage of some time period, many parts of the holographic data 85 may be lost. Because of the robustness of the holographic data 85, however, the holographic data 85 may sill be able to be reconstructed from the remaining parts.

Figure 15:
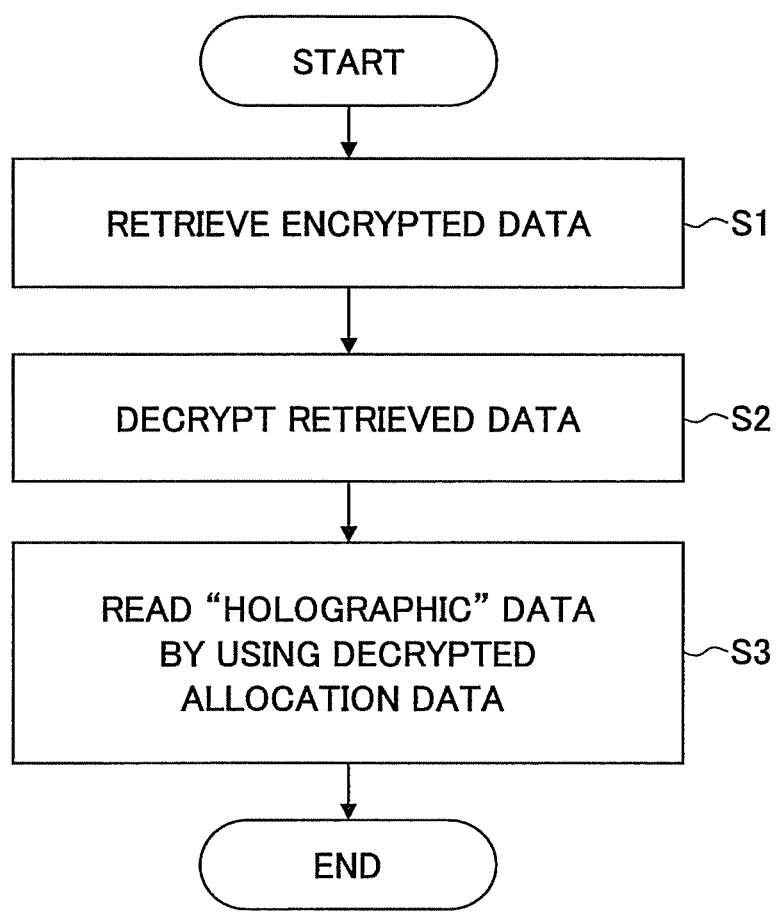
FIG. 15 is a flowchart illustrating an example process for recovering the holographic data stored by the process illustrated in FIG. 14.

FIG. 15 is a flowchart illustrating a process of recovering the holographic data 85 stored by the process illustrated in FIG. 14. In step S1, the CPU 71 may retrieve the encrypted data from the hard-disk drive 79 through the I/O IF 78. That is, the encrypted FAT entry stored in step S4 of FIG. 14 may be retrieved. In step S2, the CPU 71 may decrypt the encrypted data to obtain the FAT entry of the holographic data 85. This FAT entry may indicate cluster positions where the holographic data 85 may be stored. In step S3, the CPU 71 may access the cluster positions indicated by the FAT entry to read the holographic data 85 from the hard-disk drive 79. The retrieved holographic data 85 may be reconstructed by using the reconstruction process (i.e., cross-correlation process) previously described.

With the above-described arrangement, hackers and computer viruses may not be able to find where the hologram data exists. This may provide a protection against hacking and computer virus. As was described above, parts of the holographic data may be destroyed with the passage of time. In consideration of this, a periodic data refresh operation may be performed. Namely, the process of FIG. 15 may be performed, followed by reconstructing the original data, and the reconstructed data may be converted again into holographic data, which may then be stored in a secured manner by performing the process of FIG. 14. Such a refresh operation may be performed at constant intervals. The processes of FIG. 14 and FIG. 15 may be applied to the configuration in which holographic data may be distributed over a plurality of data storage devices as illustrated in FIG. 11 or FIG. 12.

The computer system illustrated in FIG. 13 may be used for a storage device having a higher error rate. Namely, the hard-disk drive 79 may be such a storage device having a higher error rate, or may be replaced by such a storage device. Examples of the storage device may include an ultra-fine capacitor DRAM, an HDD with a narrower magnetic record and read head gap, and all other devices where the probability of errors may become higher with increased memory capacity. The use of holographic data as a data storage format may make it possible to achieve data storage robust against an increased error rate. Errors may be detected by using a parity check, checksum, or other conventional technologies. Data for which an error may be detected may be treated as lost data. The robustness of holographic data may be changed dynamically by changing the ratio of the length of a holographic data sequence to the length of a data input sequence.

Although the present invention has been described with reference to embodiments, the present invention is not limited to these embodiments, but various variations and modifications may be made without departing from the scope of the invention as set forth in the accompanying claims.

References made in this disclosure to the term "responsive to" or "in response to" are not limited to responsiveness to only a particular feature and/or structure. A feature may also be responsive to another feature and/or structure and also be located within that feature and/or structure. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

Some portions of the foregoing detailed description are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is here, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing device, that manipulates or transforms data represented as physical electronic or magnetic quantities within memories, registers, or other information storage devices, transmission devices, or display devices of the computing device.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a flexible disk, a hard disk drive (HDD), a Compact Disc (CD), a Digital Versatile Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally may include one or more of a system unit housing, a video display device, a memory such as volatile and non-volatile memory, processors such as micro-processors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It should also be understood that, the term "optimize" may include maximization and/or minimization. The term "minimization" and/or the like as used herein may include a global minimum, a local minimum, an approximate global minimum, and/or an approximate local minimum. Likewise, it should also be understood that, the term "maximization" and/or the like as used herein may include an global maximum, a local maximum, an approximate global maximum, and/or an approximate local maximum.

Reference in the specification to "an implementation," "one implementation," "some implementations," or "other implementations" may mean that a particular feature, structure, or characteristic described in connection with one or more implementations may be included in at least some implementations, but not necessarily in all implementations. The various appearances of "an implementation," "one implementation," or "some implementations" in the preceding description are not necessarily all referring to the same implementations.

While certain example techniques have been described and shown herein using various methods and systems, it should be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

The invention claimed is:

1. A device for storing data, comprising:
a sequence generator configured to generate a first number sequence, wherein the first number sequence comprises a pseudorandom number sequence;
a cross-correlation unit configured to produce a second number sequence comprising a cross-correlation between the first number sequence and a third number sequence; and
a write and read unit configured to write the second number sequence to a memory and read the second number sequence from the memory,
wherein the cross-correlation unit is further configured to reconstruct the third number sequence by obtaining a cross-correlation between the first number sequence and the second number sequence read from the memory,
wherein the write and read unit is further configured to write a first part of the second number sequence in a first storage device and write a second part of the second number sequence in a second storage device, wherein the first storage device and the second storage device comprise at least part of the memory,
wherein the first and second storage devices are located at different locations and are accessible from one location, and
wherein the second number sequence is managed by a file allocation table that indicates cluster positions of the first and second parts of the second number sequence, wherein each entry of the first and the second parts of the second number sequence of the file allocation table is encrypted.

2. The device as claimed in claim 1, wherein the sequence generator includes a shift register configured to generate a maximal length sequence, wherein the maximal length sequence comprises the first number sequence.

3. The device as claimed in claim 1, wherein the sequence generator is configured to change a length and pattern of the first number sequence in response to control data.

4. The device as claimed in claim 2, wherein the sequence generator is configured to change at least one of one or more tap positions and a number of cascaded registers of the shift register in response to control data.

5. The device as claimed in claim 1, wherein the write and read unit includes an adder configured to produce a fourth number sequence by adding the second number sequence read from the memory to a fifth number sequence produced by the cross-correlation unit, wherein the write and read unit is further configured to write the fourth number sequence to the memory to replace the second number sequence in the memory.

6. The device as claimed in claim 1, wherein the cross-correlation unit is configured to reconstruct the third number sequence by comparing, with two threshold values, the cross-correlation between the first number sequence and the second number sequence read from the memory.

7. The device as claimed in claim 1, wherein the cross-correlation unit includes:
an input register configured to store the third number sequence as a first bit series;
a shift register including cascade-connected registers configured to shift the first number sequence;
a multiplying unit configured to perform bitwise multiplications of the first bit series stored in the input register by a second bit series stored in the shift register; and
an adding unit configured to obtain a sum of all multiplied bits resulting from the bitwise multiplications.

8. The device as claimed in claim 7, wherein the multiplying unit is further configured to perform multiplications of respective bits stored in the shift register by a single number read from the memory to generate a plurality of multiplication products, and the cross-correlation unit further includes a plurality of second adding units provided in one-to-one correspondence to the plurality of multiplication products, wherein at least one of the second adding units is configured to produce a sum of a corresponding one of the plurality of multiplication products and an immediately preceding sum produced by the at least one of the second adding units.

9. The device as claimed in claim 1, further comprising a storage unit serving as the memory.

10. The device as claimed in claim 1, wherein the write and read unit is further configured to transmit the first part of the second number sequence and the second part of the second number sequence over a network through to the first storage device and the second storage device.

11. A method of writing and reading data, comprising:
generating a first number sequence comprising a pseudorandom number sequence;
generating a second number sequence that is a cross-correlation between the first number sequence and a third number sequence;
writing the second number sequence to memory;
reading the second number sequence from the memory; and
reconstructing the third number sequence by obtaining a cross-correlation between the first number sequence and the second number sequence read from the memory,
wherein writing the second number sequence to memory includes:
writing a first part of the second number sequence in a first storage device; and
writing a second part of the second number sequence in a second storage device,
wherein the first storage device and the second storage device comprise at least part of the memory,
wherein writing the second number sequence to memory includes transmitting the first part of the second number sequence and the second part of the second number sequence over a network to the first storage device and the second storage device,
wherein the first and second storage devices are located at different locations and are accessible from one location, and
wherein the second number sequence is managed by a file allocation table that indicates cluster positions of the first and second parts of the second number sequence, wherein each entry of the first and the second parts of the second number sequence of the file allocation table is encrypted.

12. The method as claimed in claim 11, wherein said step of generating a first number sequence utilizes a shift register configured to generate a maximal length sequence, wherein the maximal length sequence comprises the first number sequence.

13. The method as claimed in claim 11, further comprising changing a length and pattern of the first number sequence in response to control data.

14. The method as claimed in claim 11, further comprising:
generating a fourth number sequence by adding the second number sequence read from the memory to a fifth number sequence generated by the cross-correlation unit; and
writing the fourth number sequence to the memory to replace the second number sequence in the memory.

15. The method as claimed in claim 11, wherein reconstructing the third number sequence comprises reconstructing the third number sequence by comparing, with two threshold values, the cross-correlation between the first number sequence and the second number sequence read from the memory.

16. A method of storing data, comprising:
generating a first number sequence, wherein the first number sequence comprises a pseudorandom number sequence;
generating a second number sequence comprising a cross-correlation between the first number sequence and a third number sequence; and
writing the second number sequence to memory, such that no index indicative of a storage position of the second number sequence exists in the memory,
wherein writing the second number sequence to memory includes:
writing a first part of the second number sequence in a first storage device; and
writing a second part of the second number sequence in a second storage device,
wherein the first storage device and the second storage device comprise at least part of the memory,
wherein writing the second number sequence to memory includes transmitting the first part of the second number sequence and the second part of the second number sequence over a network to the first storage device and the second storage device,
wherein the first and second storage devices are located at different locations and are accessible from one location, and
wherein the second number sequence is managed by a file allocation table that indicates cluster positions of the first and second parts of the second number sequence, wherein each entry of the first and the second parts of the second number sequence of the file allocation table is encrypted.

17. The method as claimed in claim 16, further comprising:
identifying a position at which the second number sequence is written in the memory;
reading the second number sequence from the memory by accessing the position in the memory; and
reconstructing the third number sequence by obtaining a cross-correlation between the first number sequence and the second number sequence read from the memory.

18. The method as claimed in claim 17, further comprising:
encrypting the position at which the second number sequence is written in the memory; and
storing the encrypted position in the memory,
wherein identifying a position comprises:
retrieving the encrypted position from the memory;
decrypting the retrieved encrypted position to identify the position.

* * * * *

UNITED STATES PATENT AND TRADEMARK OFFICE
CERTIFICATE OF CORRECTION

PATENT NO.         : 8,732,436 B2                                     Page 1 of 1
APPLICATION NO.    : 12/993094
DATED              : May 20, 2014
INVENTOR(S)        : Ueda It is certified that error appears in the above-identified patent and that said Letters Patent is hereby corrected as shown below:

In the Specification

In Column 7, Line 45, delete "of "4"" and insert -- of "-1" --, therefor.

In Column 9, Line 18, delete "$m[2^N-2]$" and insert -- $m'[2^N-2]$ --, therefor.

In Column 9, Line 20, delete "$m[0]$ through $m[2^N-2]$" and insert -- $m'[0]$ through $m'[2^N-2]$ --, therefor.

Signed and Sealed this
Sixteenth Day of September, 2014

Michelle K. Lee
*Deputy Director of the United States Patent and Trademark Office*